United States Patent
Dorleans

(10) Patent No.: US 6,448,657 B1
(45) Date of Patent: Sep. 10, 2002

(54) STRUCTURE FOR REDUCING JUNCTION SPIKING THROUGH A WALL SURFACE OF AN OVERETCHED CONTACT VIA

(75) Inventor: Fernand Dorleans, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/692,911

(22) Filed: Oct. 19, 2000

Related U.S. Application Data

(63) Continuation of application No. 09/296,144, filed on Apr. 21, 1999, now abandoned.

(51) Int. Cl.$^7$ .............................................. H01L 29/41
(52) U.S. Cl. ..................... 257/774; 257/330; 257/296; 257/306; 257/309
(58) Field of Search ................................ 438/589, 259, 438/270, 275, 789, 623, 637, 639, 675, 676; 257/330, 774, 306, 309, 296

(56) References Cited

U.S. PATENT DOCUMENTS

| | | | | |
|---|---|---|---|---|
| 4,641,420 A | * | 2/1987 | Lee ............................... | 29/511 |
| 4,897,703 A | * | 1/1990 | Spratt et al. ................... | 357/34 |
| 4,916,083 A | * | 4/1990 | Monkowski et al. .......... | 437/31 |
| 5,087,591 A | * | 2/1992 | Teng ........................... | 437/225 |
| 5,308,793 A | * | 5/1994 | Taguchi et al. .............. | 437/194 |

(List continued on next page.)

OTHER PUBLICATIONS

U.S. Patent Application Serial No. 08/511,825, of Xu et al., filed Aug. 7, 1996.
U.S. Patent Application Serial No. 08/855,059, of Ding et al., filed May 13, 1997.
U.S. Patent Application Serial No. 08/995,108, of Ding et al., filed Dec. 19, 1997.

*Primary Examiner*—Richard Elms
*Assistant Examiner*—Douglas M Menz
(74) *Attorney, Agent, or Firm*—Shirley L. Church; Kathi Bean

(57) ABSTRACT

The present invention pertains to a semiconductor device microstructure, and to a method of forming that microstructure, which reduces or prevents junction spiking and to a method of forming that microstructure. In particular, a semiconductor contact microstructure comprises a feature which includes a silicon base and at least one sidewall extending upward from the silicon base. The sidewall includes a silicon portion in contact with the silicon base, where the height of the silicon portion of the sidewall above the silicon base is typically less than about 0.5 μm. The sidewall also includes at least one portion which comprises a first dielectric material which is in contact with (and typically extends upward from) the silicon portion of the sidewall. Overlying at least the silicon portion of the sidewall is a layer of a second dielectric material, preferably silicon oxide. Typically, a diffusion barrier layer overlies the silicon base, the layer of second dielectric material, and at least part of the sidewall portion which is comprised of the first dielectric material. The method comprises the steps of: a) providing a semiconductor device feature which includes a silicon base and at least one sidewall extending upward from the silicon base, where the sidewall includes at least one silicon portion in contact with the silicon base, and another portion comprising a first dielectric material which is in contact with the silicon portion of the sidewall; and b) creating a layer of a second dielectric material, preferably silicon oxide, over the at least one silicon sidewall portion. The method may include additional steps: c) sputter etching to remove dielectric material from the surface of the silicon base; and d) applying a diffusion barrier material over the silicon base, the layer of second dielectric material, and at least a portion of the sidewall comprising the first dielectric material. Typically, both the first and second dielectric materials are silicon oxide.

12 Claims, 7 Drawing Sheets

U.S. PATENT DOCUMENTS

| | | | | |
|---|---|---|---|---|
| 5,371,041 A | * | 12/1994 | Liou et al. | 437/192 |
| 5,705,838 A | * | 1/1998 | Jost et al. | 257/296 |
| 5,721,147 A | * | 2/1998 | Yoon | 437/31 |
| 5,843,827 A | * | 12/1998 | Gregor et al. | 438/301 |
| 5,933,753 A | * | 8/1999 | Simon et al. | 438/629 |
| 5,945,738 A | * | 8/1999 | Nguyen et al. | 257/756 |
| 5,960,312 A | * | 9/1999 | Morikawa | 438/624 |
| 5,960,318 A | * | 9/1999 | Peschke et al. | 438/637 |
| 5,998,288 A | * | 12/1999 | Gardner et al. | 438/589 |
| 6,143,645 A | * | 11/2000 | Hsu et al. | 438/627 |

* cited by examiner

STRUCTURE FOR REDUCING JUNCTION SPIKING THROUGH A WALL SURFACE OF AN OVERETCHED CONTACT VIA

This application is a continuation application of application Ser. No. 09/296,144, filed Apr. 21, 1999, which is now abandoned.

BACKGROUND OF THE INVENTION

1. Field of the Invention

The present invention pertains to a structure and method for reducing or preventing junction spiking due to silicon diffusion through a wall surface of an overetched contact via formed in a silicon substrate.

2. Brief Description of the Background Art

In the fabrication of multi-layered semiconductor devices, it is common to have a single-crystal silicon substrate with a dielectric layer overlying the silicon substrate. Electrical contacts may be formed by creating an opening through the dielectric layer to the surface of the silicon substrate. The opening is subsequently filled with a conductive material, which is typically a metal such as aluminum or copper.

One of the preferred methods of producing the opening (i.e., contact via) through the dielectric layer to the surface of the silicon substrate is by plasma etching through a mask on the surface of the dielectric layer. Variance occurs in this etching process and some degree of overetch into the silicon substrate is necessary to ensure that the contact is completely open (i.e., there is no dielectric material remaining between the metal contact and the silicon substrate). The degree of overetch will vary with overall pattern factors and geometric considerations.

Conventional integrated circuit processing steps can cause silicon atoms to diffuse from single-crystal silicon into a contact of pure aluminum or pure copper adjacent to the single-crystal silicon. When the diffusion is sufficient to short out a shallow p-n junction in the silicon, this phenomenon is known as junction spiking.

In order to prevent such junction spiking, a diffusion barrier layer is typically applied over the internal surface of the contact via after etching of the opening through the dielectric layer. One of the preferred methods of application of the diffusion barrier layer is by physical vapor deposition (PVD), in particular, high density plasma sputter deposition. The use of high density plasma sputtering techniques results in the deposition of diffusion barrier layers having excellent barrier properties, even in difficult-to-fill small feature size contact vias. However, even when diffusion barrier layers are deposited using high density plasma sputtering techniques, junction spiking of contacts is still occasionally observed.

Therefore, it would be desirable to provide a new device microstructure and method of forming the structure which would reduce or prevent junction spiking due to silicon diffusion through a wall surface of an overetched contact via.

SUMMARY OF THE INVENTION

We have discovered a new semiconductor contact microstructure and a method of forming the structure which reduces junction spiking in semiconductor contact vias. The structure is applicable when the contact via has a three-dimensional shape which makes it difficult to apply a diffusion barrier layer in the area adjacent the interface between a silicon surface and a metal such as aluminum or copper.

In particular, the semiconductor contact microstructure comprises a feature which includes a silicon base and at least one sidewall extending upward from the silicon base. The sidewall includes a silicon portion in contact with the silicon base. Typically the height of the silicon portion of the sidewall above the silicon base is less than about 0.5 $\mu$m. The sidewall also includes at least one portion which comprises a first dielectric material which is in contact with (and typically extends upward from) the silicon portion of the sidewall. Overlying at least the silicon portion of the sidewall is a layer of a second dielectric material, preferably silicon oxide. In most applications, a diffusion barrier layer overlies the silicon base, the layer of second dielectric material, and at least part of the sidewall portion which is comprised of the first dielectric material. Typically, the first and second dielectric materials are both silicon oxide, although the first dielectric material may be a low k dielectric, while the second dielectric material may be silicon oxide.

The method comprises the steps of. providing a semiconductor device feature which includes a silicon base and at least one sidewall extending upward from the silicon base, where the sidewall includes at least one silicon portion in contact with the silicon base, and another portion comprising a first dielectric material which is in contact with the silicon portion of the sidewall; and, creating a layer of a second dielectric material, preferably silicon oxide, over the at least one silicon sidewall portion. The method may also include subsequent steps of sputter etching to remove dielectric material from the surface of the silicon base; and, applying a diffusion barrier material over the silicon base, the layer of second dielectric material, and at least a portion of the sidewall comprising the first dielectric material.

The method of the invention is particularly effective when used to prepare electrical contacts having a feature size of less than about 0.5 $\mu$m and an aspect ratio of greater than about 2:1.

The method of the invention greatly reduces or eliminates junction spiking at the bottom of contact vias when the via has been overetched, leaving via sidewalls exposed at the bottom of the contact which comprise silicon. Application of a dielectric layer, such as silicon oxide, over the portion of the via wall surface which comprises silicon, followed by removal of any excess dielectric formed upon the bottom surface of the via, and subsequent application of a diffusion barrier layer over the interior of the via surface, reduces the possibility of junction spiking after filling of the via with a conductive metal, such as aluminum or copper. The presence of the dielectric material on the silicon sidewall of the via is effective to protect this portion of the sidewall from diffusion into the conductive metal with subsequent current leakage.

DETAILED DESCRIPTION OF THE INVENTION

We have discovered a new semiconductor contact microstructure and a method of forming the structure which reduces or eliminates junction spiking in semiconductor contact vias. The structure is particularly applicable when the contact via has a three-dimensional shape which makes it difficult to apply a diffusion barrier layer in the area adjacent the interface between a silicon surface and a metal such as aluminum or copper.

Figure 1:
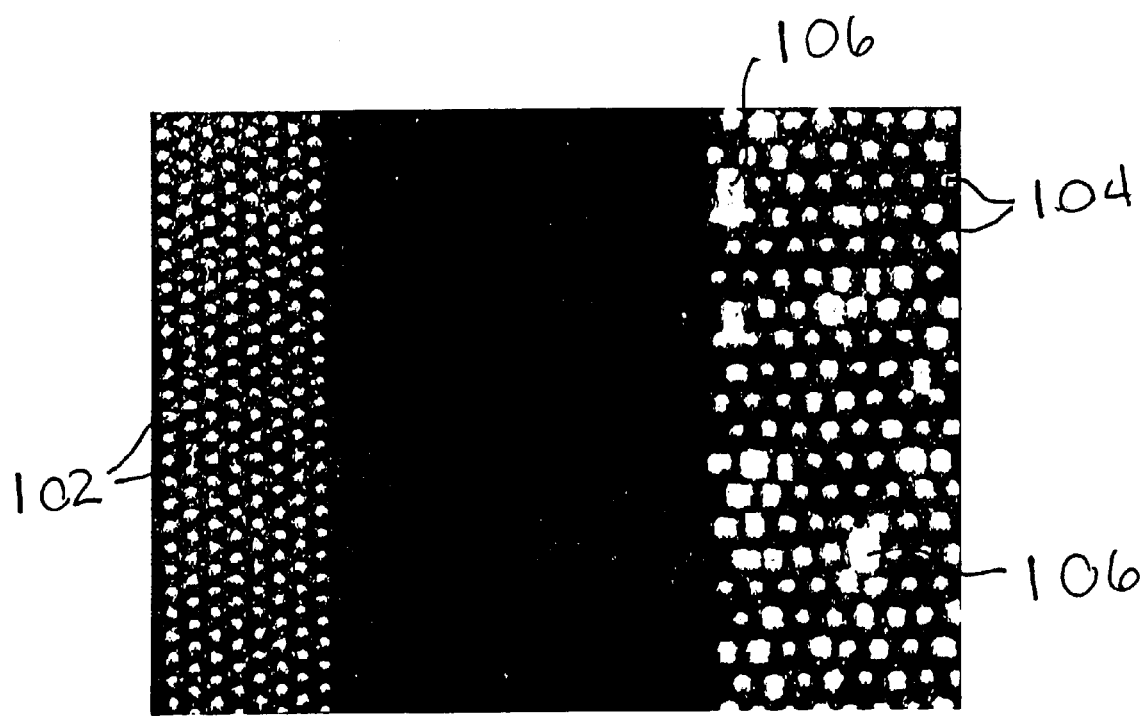
FIG. 1 shows a schematic representative of the appearance of a typical photomicrograph of small contacts 102 (approximately 0.25 $\mu$m feature size) and larger contacts 104 (approximately 0.5 $\mu$m) which were fabricated simultaneously, so that the contact vias were etched simultaneously during the same etching process on the same silicon wafer.

FIG. 1 shows a schematic which illustrates the appearance of a typical photomicrograph of small contacts (approximately 0.25 $\mu$m feature size) and larger contacts (approximately 0.5 $\mu$m) which were fabricated simultaneously. This permitted a comparison of the junction spiking phenomenon as a function of the feature size. Referring to FIG. 1, reference numeral 102 designates small contacts having a feature size of approximately 0.25 $\mu$m, and reference numeral 104 designates larger contacts having a feature size of approximately 0.5 $\mu$m. The contacts 102 and 104 exhibited the basic contact via structure shown in FIG. 2 and described in detail below. A diffusion barrier layer of titanium/titanium nitride about 200 Å to about 600 Å thick was applied over the basic contact via using a high density plasma reactive sputtering technique, followed by an aluminum fill of the contact using a high density plasma sputtering technique, which is described in more detail subsequently herein. A fairly severe degree of junction spiking 106 was observed with for this microstructure for larger contacts; no junction spiking was observed with the smaller contacts.

Figure 2:
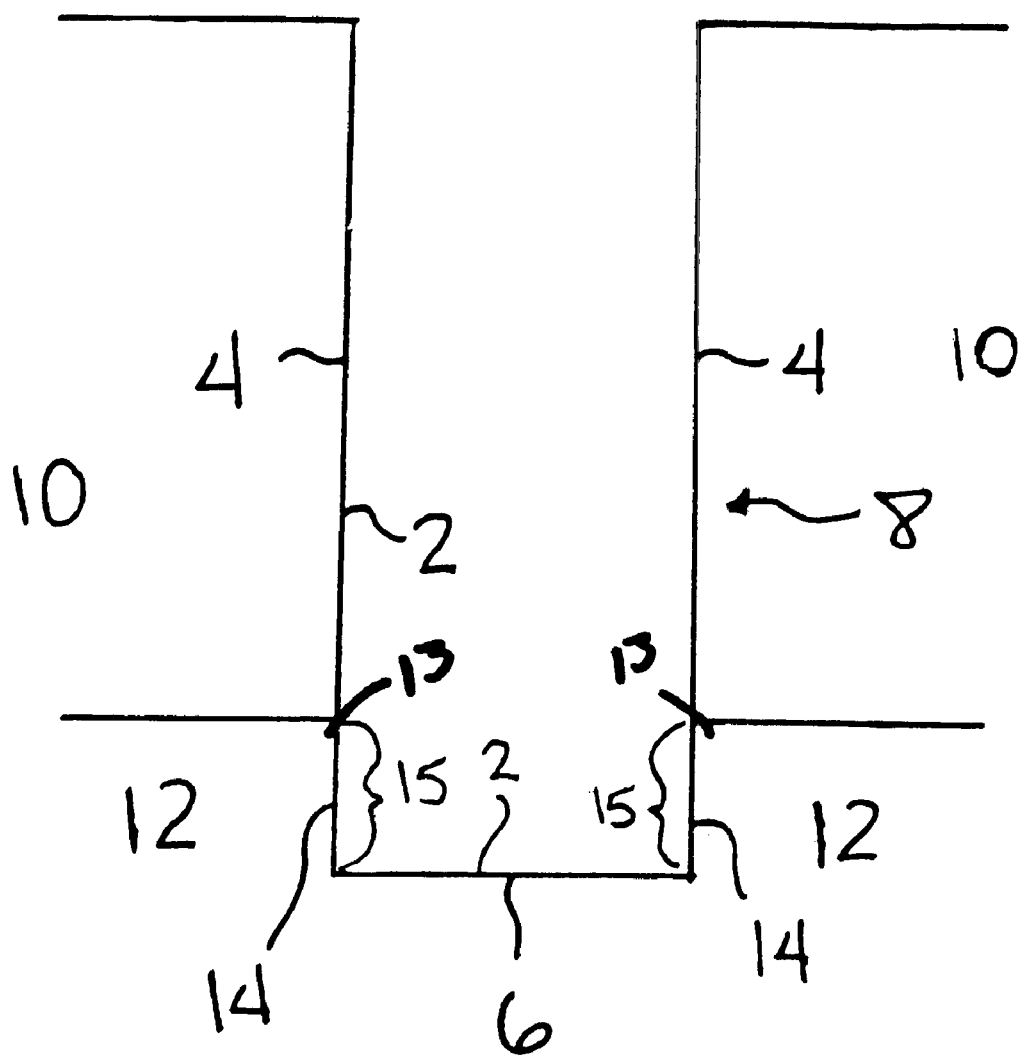
FIG. 2 shows an overetched contact via 8.

FIG. 2 shows a typical contact via 8 etched through a dielectric layer 10 and overetched into a silicon substrate 12. During etching of contact vias, some degree of overetch into the underlying silicon substrate 12 is necessary to ensure that the contacts are completely open. As shown in FIG. 2, overetching of contact vias exposes an etched silicon surface 15 on the lower sidewall 14, as well as the bottom 6, of the contact via 8.

Figure 3:
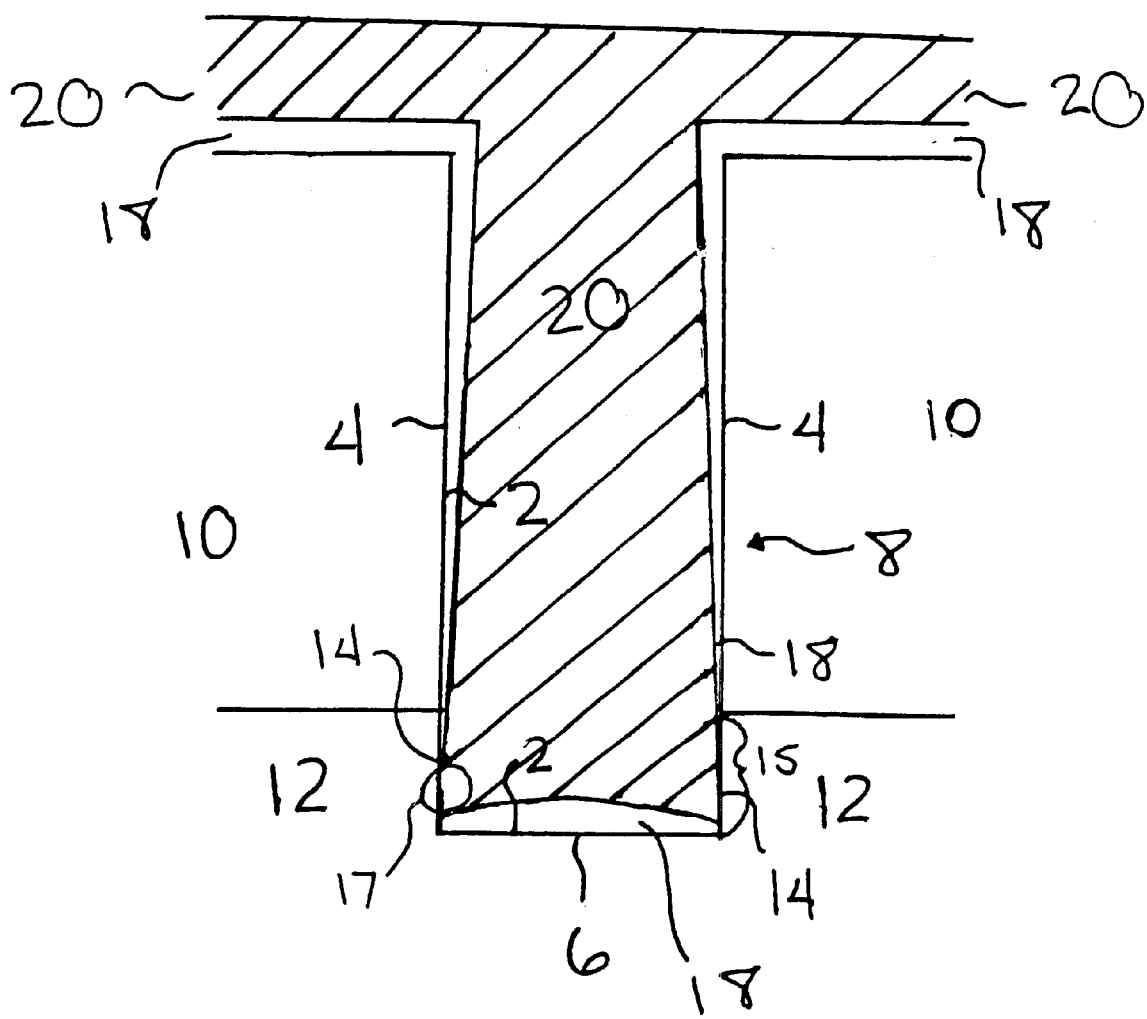
FIG. 3 shows the contact via of FIG. 2 after deposition of a diffusion barrier layer 18 over the surface of the contact via 8 using high density plasma deposition techniques.

With reference to FIG. 3, after etching of the opening through the dielectric layer 10, a diffusion barrier layer 18 is applied over the internal surface of the contact via 8 to prevent the diffusion of adjacent materials across the boundaries between the materials. When the conductive fill material 20 is aluminum, the diffusion barrier layer 18 is typically a combination of a titanium wetting layer followed by a titanium nitride barrier layer. The diffusion barrier layer 18 may be tungsten/tungsten nitride. When the conductive fill material 20 is copper, the diffusion barrier layer 18 is typically a combination of a tantalum wetting layer followed by a tantalum nitride barrier layer.

One of the preferred methods of application of the diffusion barrier layer 18 is by physical vapor deposition (PVD), in particular, high density plasma sputtering. In particular, high density plasma sputtering refers to deposition sputtering, where sputtered material is passed through an ionization means, such as an inductively coupled RF source, to create a high density, inductively coupled RF plasma between the sputtering cathode (target) and the substrate support electrode. This ensures that a higher portion of the sputtered emission is in the form of ions at the time it reaches the substrate surface. Although not always required, depending on the device topography and the amount of substrate self-bias, the substrate toward which the sputtered ions are moving is typically biased to attract the incoming ions. The use of high density plasma sputtering techniques results in the deposition of diffusion barrier layers having excellent barrier properties, even in difficult-to-fill small feature size contacts.

However, high density plasma sputter deposition is not completely conformal when the feature size of the contact is below about 0.25 $\mu$m and the aspect ratio of the via exceeds about 2:1. As a result, the amount of diffusion barrier layer deposited on the walls of the via near the bottom of the contact is minimal, even though the thickness of the diffusion barrier layer at the bottom of the contact (i.e., on the silicon surface at the bottom of the contact) is more than adequate.

Despite the minimal thickness of the diffusion barrier layer deposited near the bottom of the contact for high aspect ratio features, PVD is generally preferred over chemical vapor deposition (CVD), which provides a more conformal coating. This is because PVD is a cleaner, more environmentally friendly process; chemical vapor deposition (CVD) results in the production of undesirable chemical by-products.

The present invention permits the use of the cleaner PVD (sputtering) deposition of the diffusion barrier layer without the concern that junction spiking may occur in corners at the base of the contact, where the minimal thickness of a diffusion barrier layer might permit diffusion of silicon into an aluminum fill layer.

FIG. 3 shows a diffusion barrier layer 18 that has been deposited over the interior surface 2 of an overetched contact via 8 (such as that shown in FIG. 2) using high density plasma deposition techniques. High density plasma sputter deposition provides less barrier layer coverage on the sidewalls 4 than on the bottom 6 of a contact via 8, and minimal barrier layer coverage of the lower sidewalls 14, which are exposed silicon 12 due to overetching. Because the barrier layer 18 is so thin (as shown in the circled area indicated by reference numeral 17) on the lower sidewalls 14, it provides minimal protection against silicon diffusion. As such, although the contact bottom 6 is protected against migration of silicon 12 into the aluminum or copper fill layer 20, the silicon may migrate through the thin diffusion barrier layer 18 on the lower sidewall 14 of an overetched contact 8.

It is much easier to apply a continuous diffusion barrier layer over the surface of a larger contact via having a lower aspect ratio than it is to apply a continuous diffusion barrier layer over the surface of a small contact via having a higher aspect ratio. One skilled in the art would then presume that junction spiking would occur less frequently with larger contacts. However, as shown in FIG. 1, we observed significantly more junction spiking with larger contacts than with smaller contacts that had been formed in the same substrate during the same etching process.

With reference to FIG. 2, we determined that, because larger contact vias etch faster, the larger contact vias exhibited a much greater degree of overetch into the underlying silicon layer 12 than the smaller contact vias. As a result, there is more exposed silicon surface 15 on the lower sidewalls 14 of the larger contacts than on the lower sidewalls 14 of the smaller contacts. The increase in exposed silicon surface 15 provides an increased area available for migration of the silicon 12 into the aluminum or copper fill layer 20. Diffusion of silicon 12 into the aluminum or copper fill layer 20 creates a pathway for junction spiking, which increases current leakage.

The present invention pertains to a device microstructure which reduces or prevents junction spiking and to a method of forming that microstructure. In particular, applicants have discovered that a contact via microstructure having an exposed silicon base and overetched silicon sidewalls adjacent the silicon base can be better protected from migration of the silicon into a metallic fill of the contact by providing a layer of a dielectric material such as silicon oxide over the overetched silicon sidewalls prior to application of the diffusion barrier layer and the metallic fill. The presence of the dielectric material on the overetched silicon sidewalls reduces or prevents junction spiking in a completed contact. Applicants have formed the contact via microstructure described above by forming a layer of silicon oxide over the silicon surfaces exposed during etch of the basic contact via, and then removing the portion of the silicon oxide layer which overlies the bottom of the contact via by sputter cleaning (etching) under anisotropic conditions, which leaves intact the silicon oxide layer on the exposed silicon sidewalls, while removing the silicon oxide on the silicon surface at the bottom of the contact via. Subsequently, a barrier layer was applied over the interior of the contact via, followed by a metal fill of the contact. The contact via microstructure produced by this method is effective in reducing or preventing migration of silicon through the contact via sidewall to the metallic fill within the contact via, which leads to subsequent current leakage.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF or DC (or both) glow discharge, and reference to "the contact material" includes any conductive, metallic material which has a melting point temperature which enables its use as a contact via fill material.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example.

The term "aspect ratio" refers to the ratio of the height dimension to the width dimension of particular openings into which an electrical contact is to be placed. For example, a contact via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "bottom coverage" refers to the ratio of the thickness of the film layer deposited at the bottom of an interconnect feature, such as a contact via, to the thickness of the film layer deposited on the field surface, expressed as a percentage. For example, if the layer of film deposited at the bottom of a contact via has a thickness of 1 $\mu$m, and the layer of film deposited on the field surface has a thickness of 10 $\mu$m, the bottom coverage of the film would be 10%.

The term "completely filled" refers to the characteristic of a feature, such as a trench or via, which is filled with a conductive material, wherein there is essentially no void space present within the portion of the feature filled with conductive material.

The term "copper" includes alloys of copper of the kind typically used in the semiconductor industry.

The term "diffusion barrier layer" refers to any barrier film or coating on the surface of a contact via or other feature which is effective as a barrier to prevent diffusion of atoms of material from one layer into atoms of another material in an adjacent layer.

The term "feature" refers to contacts, vias, trenches, and other structures which make up the topography of the substrate surface. As used herein, the term "small feature" refers to a feature having a width dimension (i.e., diameter) of less than 0.5 $\mu$m.

The term "high density plasma sputter deposition" or "ion metal plasma sputter deposition" refers to sputter deposition, preferably magnetron sputter deposition (where a magnet array is placed behind the target), where a high density, inductively coupled RF plasma is created between the sputtering cathode and the substrate support electrode, whereby at least a portion of the sputtered emission is in the form of ions at the time it reaches the substrate surface. In high density plasma sputtering, the percentage of target material which remains ionized approaching the substrate surface ranges from 10% up to about 90%.

The term "tantalum nitride" refers to a compound comprising tantalum and nitrogen and having the general formula TaN$_x$, wherein x ranges from about 0.8 to about 1.5.

The term "titanium nitride" refers to a compound comprising titanium and nitrogen and having the general formula TiN$_x$, wherein x ranges from about 0.8 to about 1.5.

II. AN APPARATUS FOR PRACTICING THE INVENTION

The method of the present invention may be carried out using equipment/apparatus standard in the industry for semiconductor processing. Preferably the equipment enables the user to perform all of the process steps under a controlled environment so that the substrate is not exposed to contamination or undesirable chemical reactants. The more preferred PVD apparatus enables separate control of power to the plasma source generator and power used to bias the semiconductor substrate. Another preferred feature of the PVD apparatus is an ability to provide a high density plasma. If the dielectric layer to be formed over the silicon portion of the contact sidewall is to be formed by oxidation of the silicon surface to silicon oxide, the apparatus includes rapid thermal processing capability. If this dielectric layer is deposited using CVD techniques, then an apparatus which enables CVD is required, for example. Removal of dielectric material from the base of the contact is accomplished using apparatus known in the industry for sputter cleaning or plasma etching. Multi-chamber processing systems are available from industry sources such as Applied Materials Inc., of Santa Clara, Calif.

III. THE CONTACT VIA MICROSTRUCTURE WHICH REDUCES OR PREVENTS JUNCTION SPIKING

Figure 6:
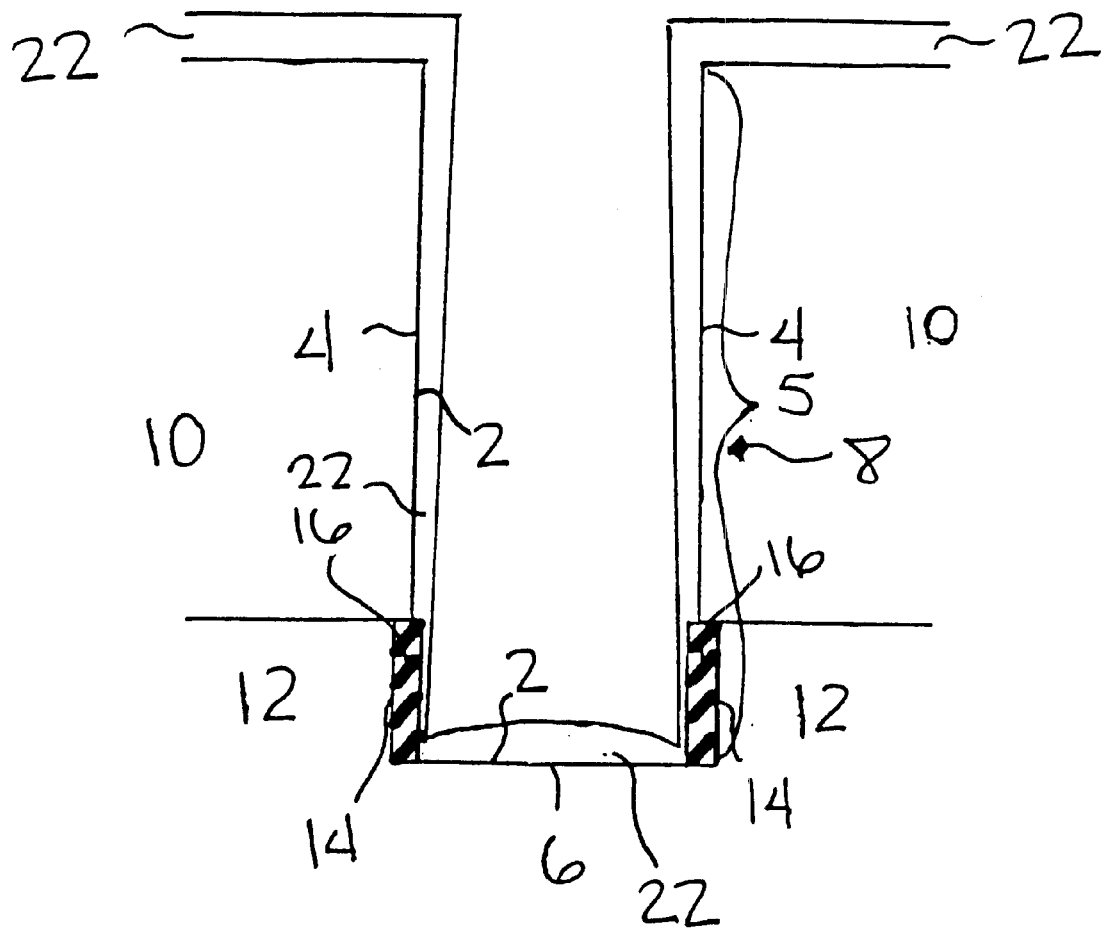
FIG. 6 shows a second semiconductor microstructure of the present invention, after deposition of a barrier layer 22 over the microstructure shown in FIG. 5.

Referring to FIG. 6, one embodiment of the semiconductor contact microstructure of the invention comprises a diffusion-barrier-lined feature 8 comprising a silicon base 12 and a sidewall 5 which includes a silicon sidewall 14 adjacent the silicon base 12. The silicon sidewall extends less than 0.5 µm upward from the base of the feature. The remainder 4 of the sidewall 5 of the feature 8 comprises a first dielectric material 10. Overlying the silicon sidewall portion 14 is a layer 16 of a second dielectric material (which may or may not be the same material as the first dielectric material 10). Overlying the silicon base 6, the dielectric portion 4 of the sidewall 5, and at least a portion of the silicon sidewall 14 is a diffusion barrier layer 22.

The second dielectric material is preferably selected from the group consisting of silicon oxide, silicon nitride, phosphorus silicon glass (PSG), and boron phosphorus silicon glass (BPSG); more preferably, silicon oxide; most preferably, thermally generated silicon oxide. The thickness of the dielectric layer 16 overlying the silicon sidewall portion 14 is preferably within the range of about 50 Å to about 100 Å.

The diffusion barrier layer 22 preferably comprises a material selected from the group consisting of titanium, titanium nitride, tantalum, tantalum nitride, and combinations thereof. The thickness of the diffusion barrier layer 22 is application-dependent and will vary depending upon the desired end-use of the contact via microstructure.

IV. THE METHOD OF FORMING THE CONTACT VIA MICROSTRUCTURE WHICH REDUCES OR PREVENTS JUNCTION SPIKING

The method of the invention for reducing or preventing junction, spiking due to silicon diffusion in an overetched contact via comprises the following general steps:

a) providing a semiconductor device feature which includes a silicon base, at least one silicon sidewall portion in contact with and extending upward from the silicon base, and at least one sidewall .portion comprising a first dielectric material which is in contact with and extends upward from the silicon portion of the sidewall, and b) creating a layer-of a second dielectric material over the at least one silicon sidewall portion. Typically, the method also includes the steps:

c) sputter etching to remove dielectric material from the surface of the silicon base; and d) applying a diffusion barrier material-over the silicon base, the second dielectric layer overlying the silicon sidewall, and at least a portion of the sidewall comprising a first dielectric material.

Figure 4:
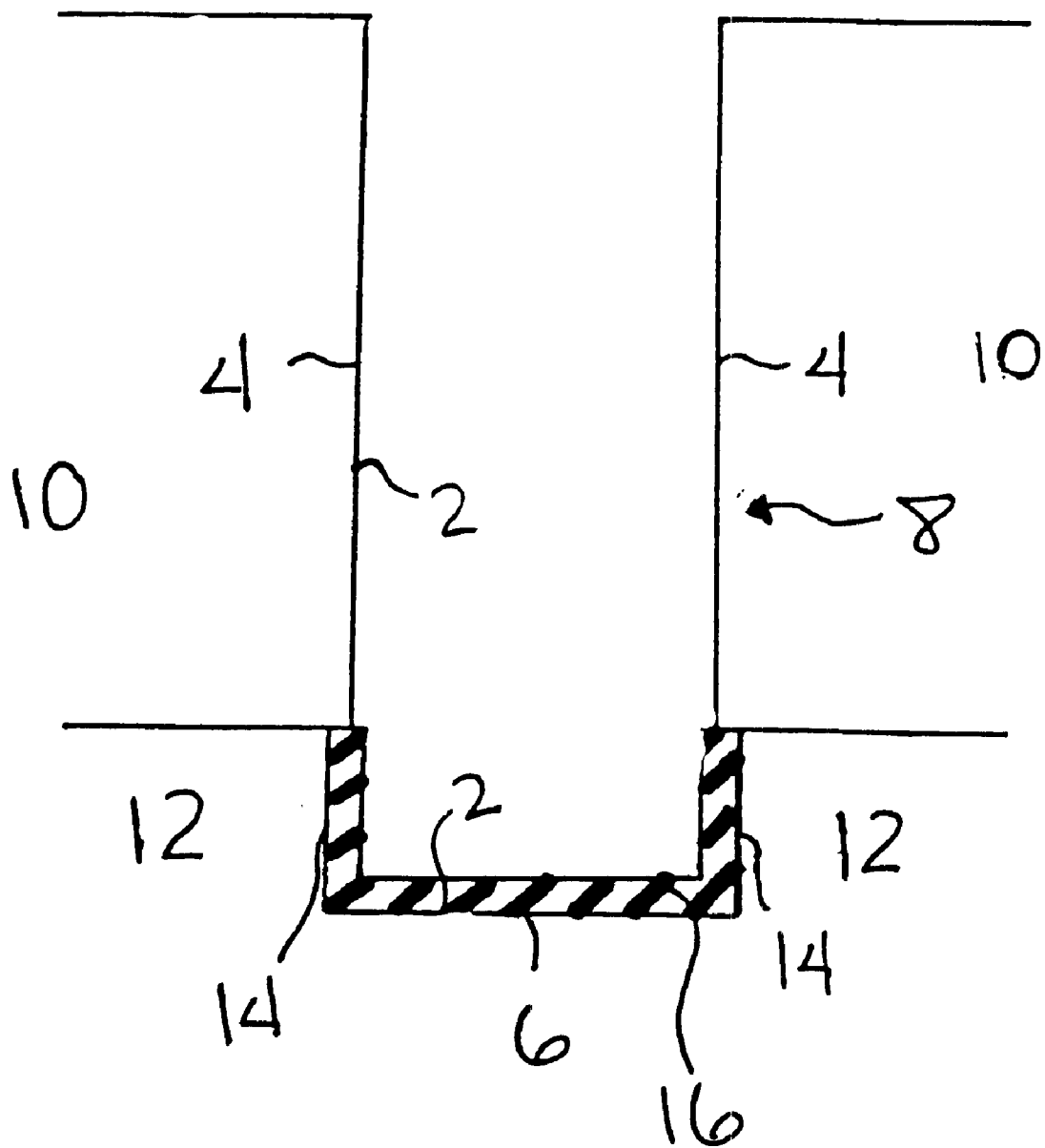
FIG. 4 shows the contact via of FIG. 2 after formation of a dielectric layer 16 on the bottom 6 and on the exposed silicon portion 14 of the contact via sidewalls 4.

Referring to FIG. 4, the first step (a) of the method of the present invention involves providing a semiconductor device feature 8 which includes a silicon base 12, at least one silicon sidewall. 14 extending upward from the silicon base less than about 0.5 µm, and at least one sidewall 4 comprising a first dielectric material which extends upward from the silicon sidewall 14. According to step (b), a layer 16 of a second dielectric material is formed on the bottom 6 and on the lower exposed silicon sidewalls 14 of the overetched contact via 8. The dielectric layer 16 is preferably formed to have a thickness within the range of about 50 Å to about 100 Å on the exposed silicon sidewalls 14.

The second dielectric material is preferably selected from the group including silicon oxide, silicon nitride, PSG, and BPSG, but may be selected from other dielectric materials known to those skilled in the art. The second dielectric material most preferably comprises silicon oxide, which is typically formed by thermal oxidation. When the second dielectric material is formed by thermal oxidation, it will form only on the exposed silicon surface, as shown in FIG. 4. Silicon oxide deposited from TEOS using chemical vapor deposition (CVD) techniques known in the art is also acceptable. In addition, a PSG or BPSG or other dielectric layer may be deposited on the interior surface of the contact via using CVD techniques known in the art. When the second dielectric material is formed by CVD deposition, it may extend not only over the exposed silicon surface, as shown in FIG. 4, but may also extend over at least a portion of the first dielectric layer 10 (this extension over first dielectric layer 10 is not shown in FIG. 4). The advantage to using CVD to deposit the second dielectric material is that the possibility of diffusion of silicon from comer 13, as shown in FIG. 2, is reduced. The disadvantage is that the purity of the dielectric deposited may not be as good.

Figure 5:
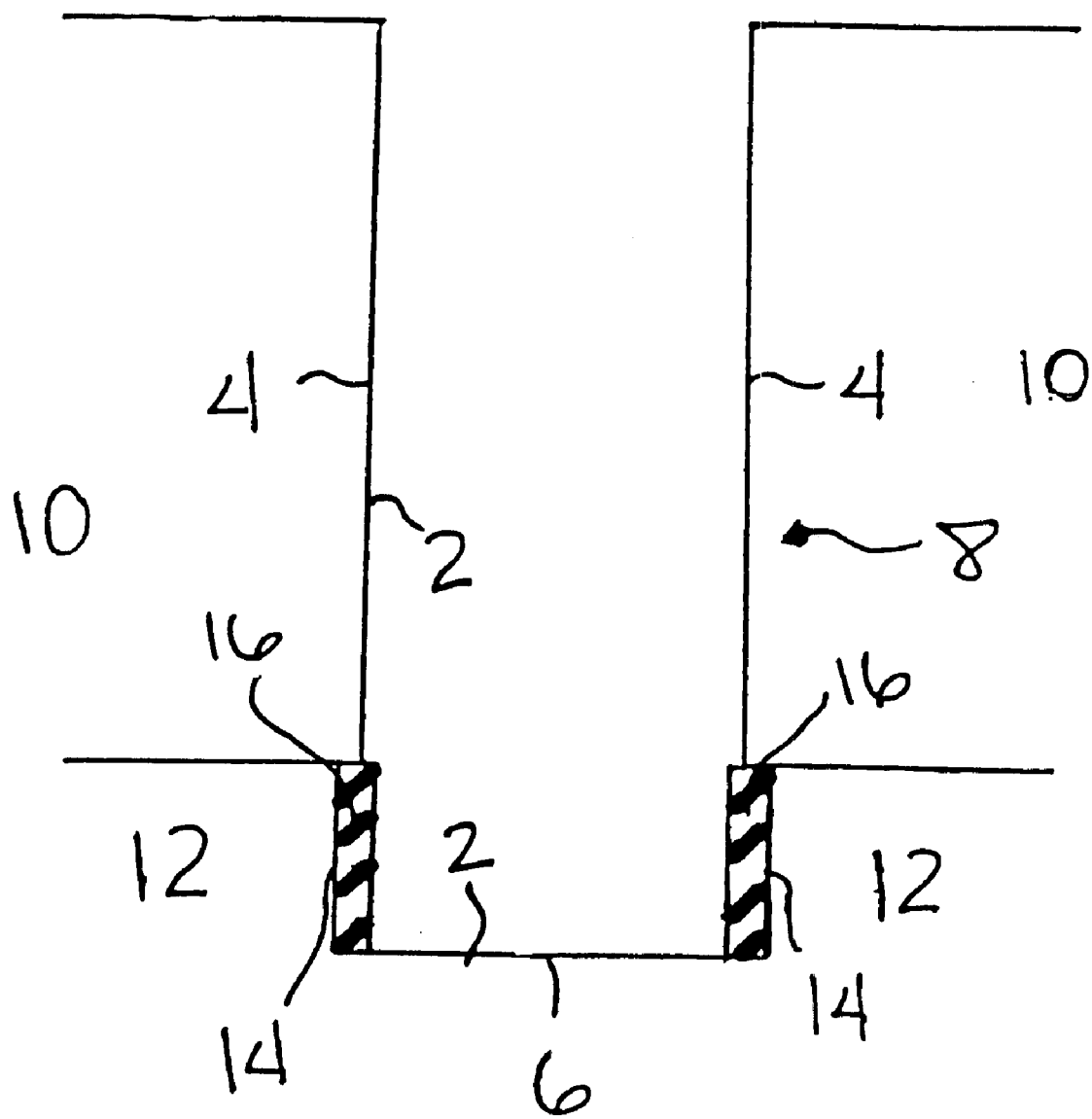
FIG. 5 shows one semiconductor microstructure of the present invention, which is the contact via of FIG. 4 after sputter etching to remove the dielectric layer 16 from the bottom 6 of the contact via 8.

Referring to FIG. 5, the third step (c) of the present invention comprises sputter etching to remove the dielectric material 16 from the bottom 6 of the contact via 8, but not from the sidewalls 14 of the contact via 8. A sputter etch step (which may be called a "preclean" step) cleans the bottom 6 of the contact via 8 to expose bare silicon 12. Preferably, the amount of material removed from the bottom 6 of the contact via 8 is equal to approximately 1.5 times the thickness of the dielectric layer 16 which was deposited on the bottom of the contact via. For example, if 100 Å of dielectric material were deposited on the bottom of the contact via, then roughly 150 Å of dielectric material would be removed from the bottom of the contact via by sputter etching in order to ensure that all of the dielectric material had been removed from the bottom of the contact via. The sputter etch step is carried out under anisotropic conditions, so that all of the dielectric material can be removed from the bottom of the contact via, while minimal dielectric material is removed from the sidewall.

A multi-chamber processing system having a separate sputter clean chamber, such as the Applied Materials, Inc. (Santa Clara, Calif.) Endura® Integrated Processing System with Preclean™ II sputter clean chamber, is preferably used.

Typical process conditions for the sputter etch step are as follows: The argon flow rate into the process chamber is set at about 5 sccm; and the RF plasma source power is set to be in the range of about 400 kHz and at about 300 W. The power supply to the semiconductor substrate support platen, which was used to create a substrate bias, is set at about 13.56 MHZ and at about 300 W, to produce a bias on the substrate of about −250 V. The pressure in the process chamber was about 0.5 mTorr to about 2.0 mTorr, the substrate temperature is about 300° C. A typical sputter etch time is about 25 seconds.

Referring to FIG. 6, the final step (d) of the present invention comprises depositing a diffusion barrier layer 22 over the interior surface 2 of the contact via 8, including the bottom 6 of the contact via 8, to reduce the possibility that silicon can diffuse at the juncture between the sputtered bottom 6 of the contact via 8 and the deposited sidewall dielectric 16. It is preferable to deposit the diffusion barrier layer 22 over the via interior surface so that the thickness of the diffusion barrier layer 22 at the bottom 6 of the contact 8 is greater than 50% of the thickness of the dielectric layer 16 sputtered off the bottom of the contact via during the preclean step.

If the contact via 8 is to be subsequently filled with aluminum, the diffusion barrier layer 22 is preferably titanium, titanium nitride, or a combination thereof. If the contact via 8 is to be filled with copper, the diffusion barrier layer 22 is preferably tantalum, tantalum nitride, or a combination thereof Other, less preferred barrier metals which may be used in the method of the invention include tungsten, zirconium, vanadium, chromium, molybdenum, niobium, or hafnium.

The diffusion barrier layer 22 is preferably deposited by physical vapor deposition or chemical vapor metal deposition, most preferably, by high density plasma sputter deposition.

High density plasma sputter deposition of a titanium/titanium nitride diffusion bi-layer is described, for example, in U.S. application Ser. No. 08/511,825, of Xu et al., assigned to the assignee of the present invention, the disclosure of which is hereby incorporated by reference herein in its entirety and summarized below. In general, the process for deposition of a titanium/titanium nitride diffusion barrier layer comprises the steps of sputtering a titanium target, ionizing at least a portion of the titanium (10% to 100%) before it is deposited on the substrate, attracting the ionized target material toward a biased substrate and forming a first sub-layer which essentially performs a surface-wetting function, and then introducing a sufficient quantity of nitrogen into the chamber as sputtering and ionization continues, and reacting the nitrogen with the sputtered titanium to form a film layer of titanium nitride (TiN) on the substrate. The flow of nitrogen gas to the chamber is typically discontinued just prior to discontinuance of titanium target sputtering.

The specific process parameters for deposition of Ti/TiN barrier layers will vary depending upon a variety of factors, including the particular equipment used and the desired deposition rate of the Ti/TiN layer. In an Applied Materials' ENDURAD® process chamber, to obtain a deposition rate of titanium nitride/titanium layer of about 300 Å per minute upon the surface of an 8 inch (20.3 cm) diameter substrate, 1.5 kW of RF power at 2 MHZ is applied to an internal coil, while 5 kW of DC power is applied to the titanium target cathode, and an AC bias of 90 W at 350 kHz is applied to the substrate platen electrode, resulting in a DC self-bias of about 70 V. The sputtering and ionization of the sputtered material is typically carried out in a process chamber with the chamber pressure ranging from about 20 mTorr to about 30 mTorr. To obtain the 300 Å per minute deposition rate, the sputtering and ionization of the sputtered material is preferably carried out at about 30 mTorr. This pressure corresponds to an argon feed rate of about 70 sccm. The temperature of the substrate in the process chamber is typically about 50° C.

High density plasma sputter deposition of tantalum/tantalum nitride diffusion barrier layers is described, for example, in U.S. application Ser. No. 08/995,108, of Ding et al., assigned to the assignee of the present invention, the disclosure of which is hereby incorporated by reference herein in its entirety and summarized below. To form a TaNs/Ta barrier layer structure, a tantalum target cathode is used, and a DC power is applied to this cathode over a range from about 0.5 kW to about 8 kW. The spacing between the target cathode and the workpiece is approximately 200–300 mm. During the formation of the $TaN_x$ first layer, argon gas feed to the process chamber is about 15 sccm to the substrate support platen and about 7 sccm to the openings in the vicinity of the target cathode. Nitrogen gas is also fed into the vacuum chamber in the vicinity of the target cathode. The nitrogen gas feed rate ranges from about 2 to about 20 sccm, depending on the DC power applied, with the nitrogen feed rate being increased as the DC power is increased. With the DC power set at 4 kW and a nitrogen feed rate of about 14 sccm, the $TaN_x$ layer produced is $TaN_{0.7}$, containing about 40 atomic percent nitrogen. The substrate is placed a distance of about 10 inches (25 cm) from the target cathode. The operational pressure in the vacuum chamber is about 1.7 mTorr, and the substrate temperature is about 25° C. Under these conditions, a 500 Å thick layer of TaN can be applied in approximately one minute. Subsequent to application of the TaN layer, the nitrogen gas is shut off, the power to the tantalum target cathode is reduced from about 4 kW to about 1 kW, and the argon gas feed is maintained. The pressure in the vacuum chamber remains at about 1.7 mTorr, and the substrate temperature remains at about 25° C. Under these conditions, a 60 Å thick layer of tantalum can be formed over the TaN layer in about 10 seconds.

Figure 7:
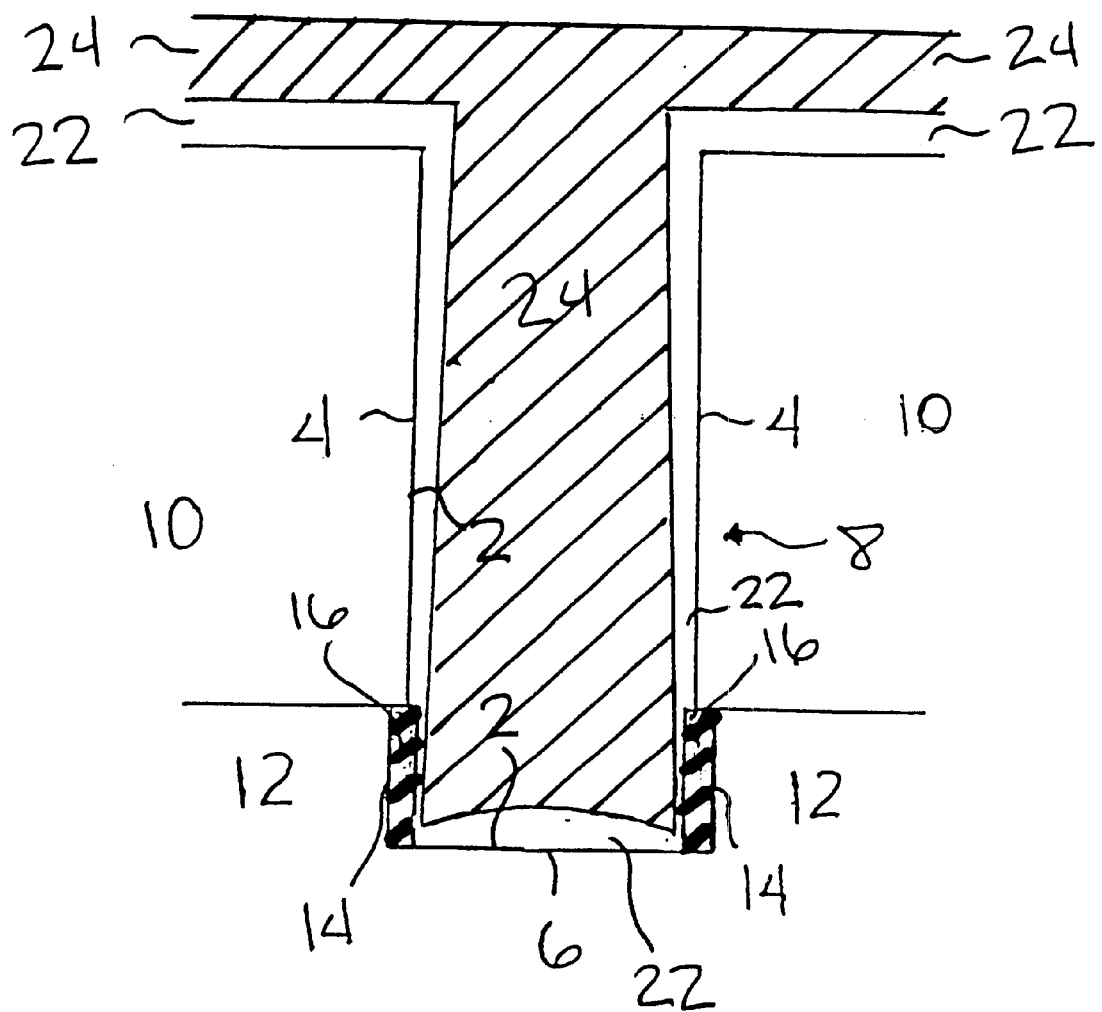
FIG. 7 shows a third semiconductor microstructure of the present invention, after deposition of a metal fill layer 24 to form a contact.
Figure 1:
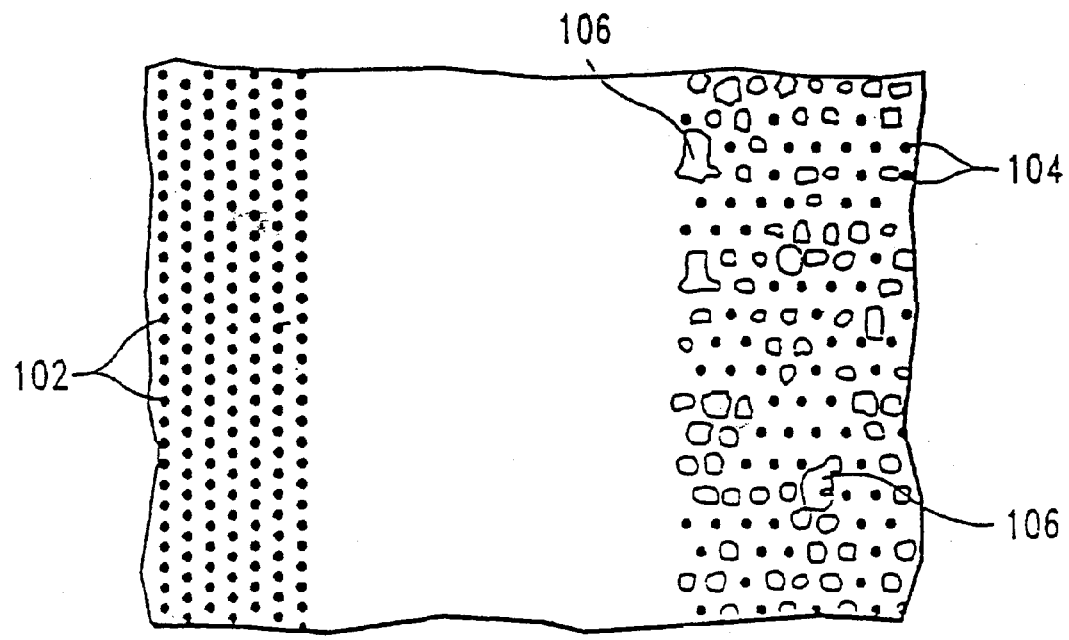
Figure 2:
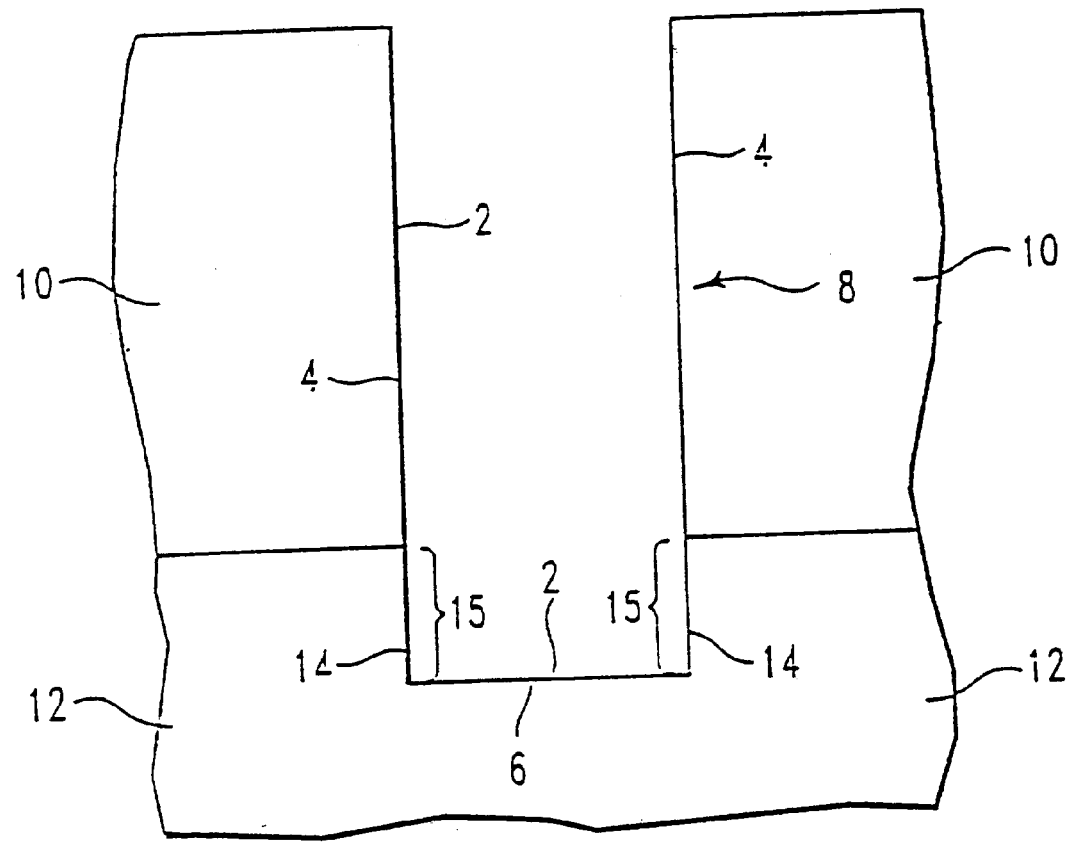
Figure 3:
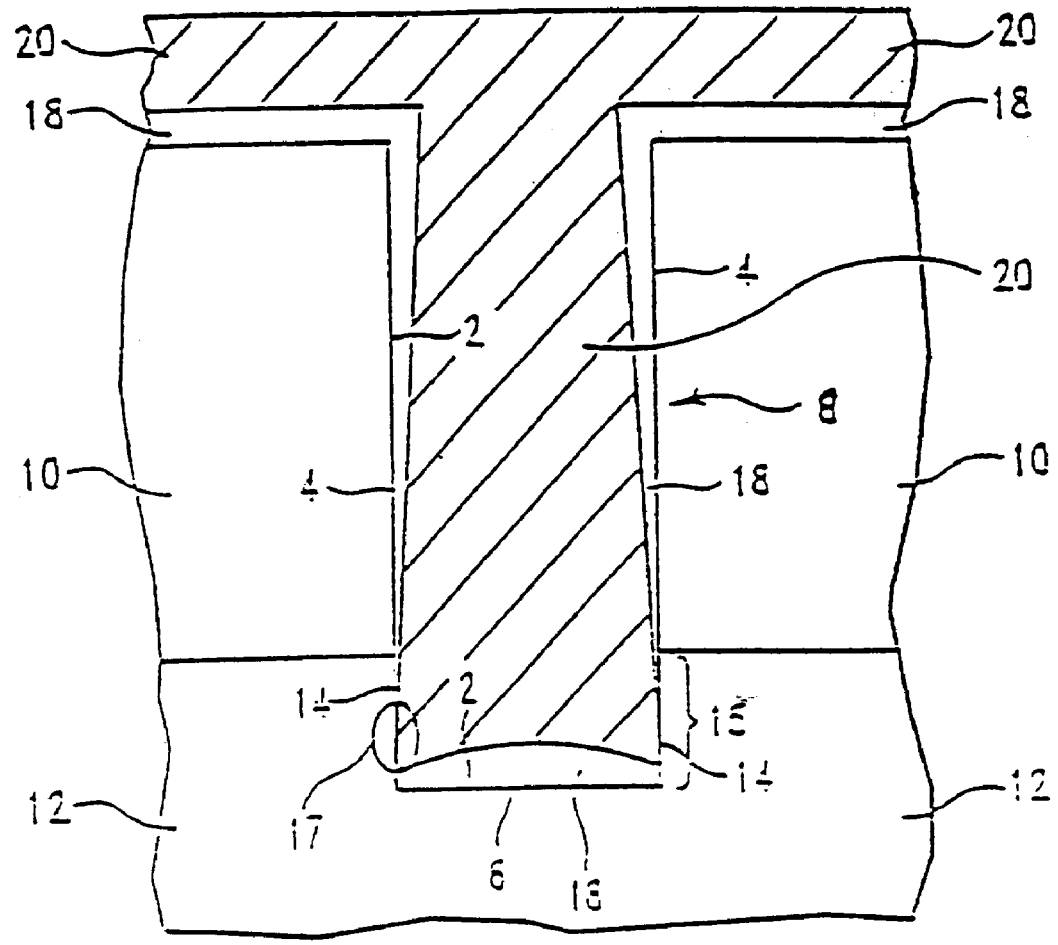
Figure 4:
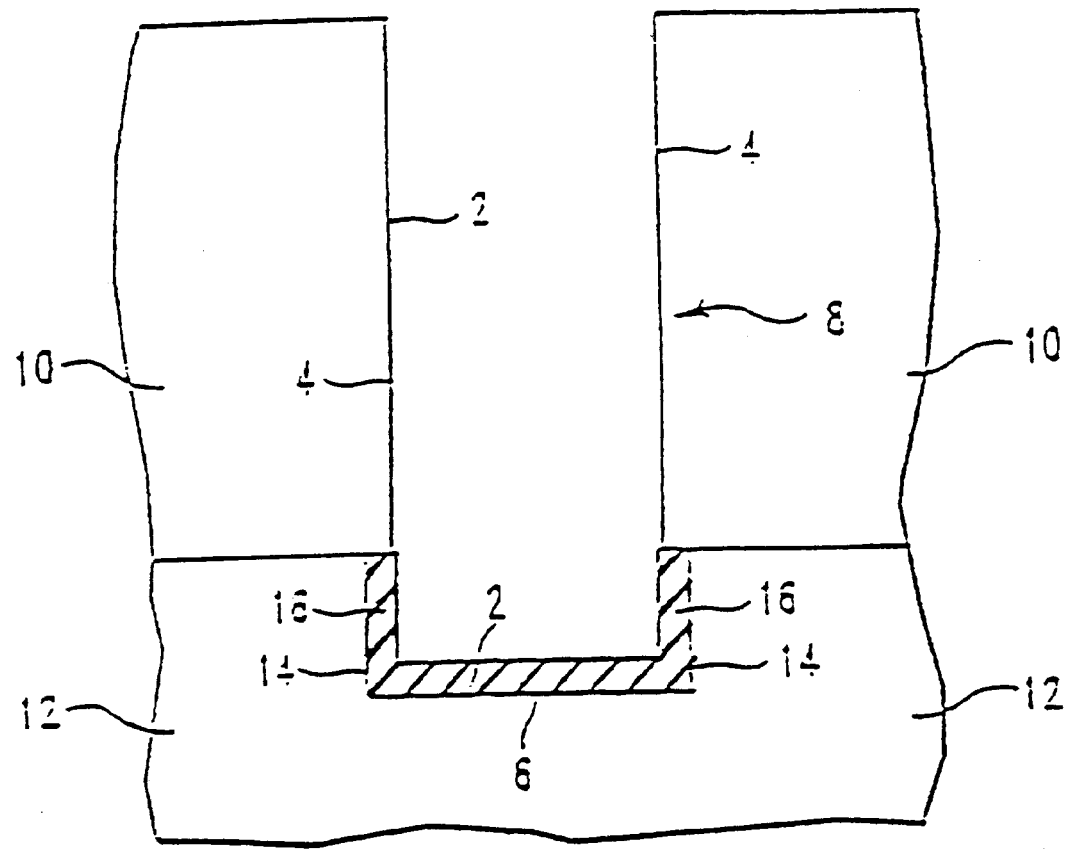
Figure 5:
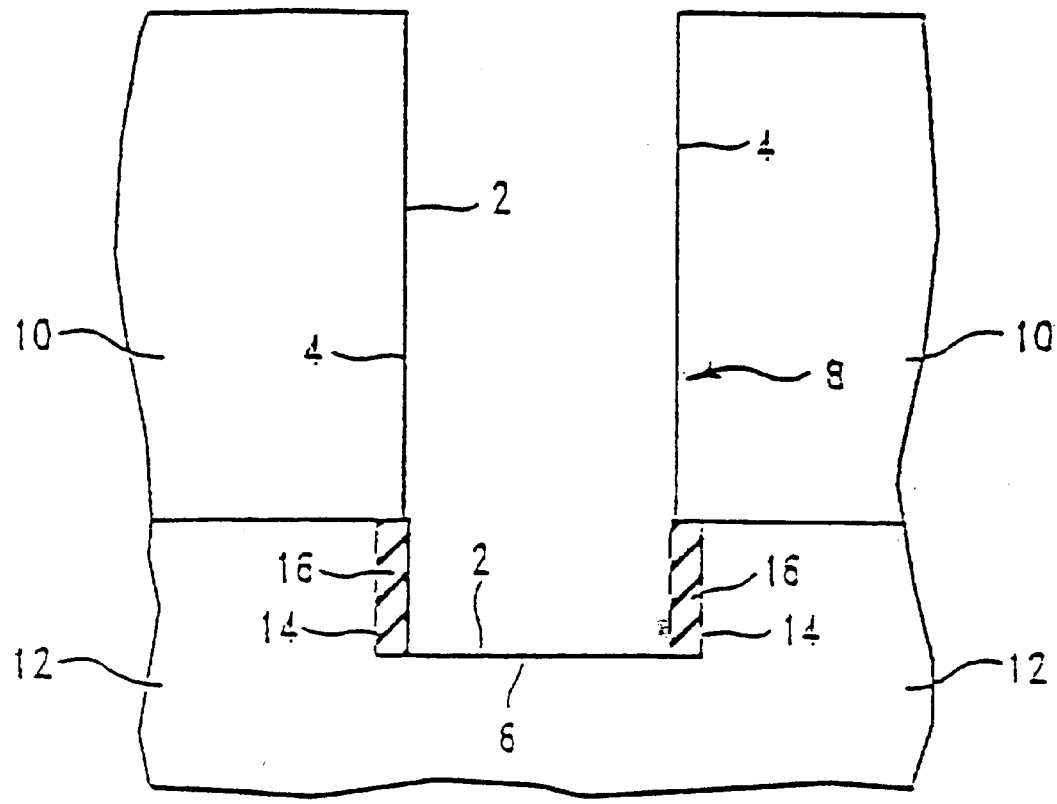
Figure 6:
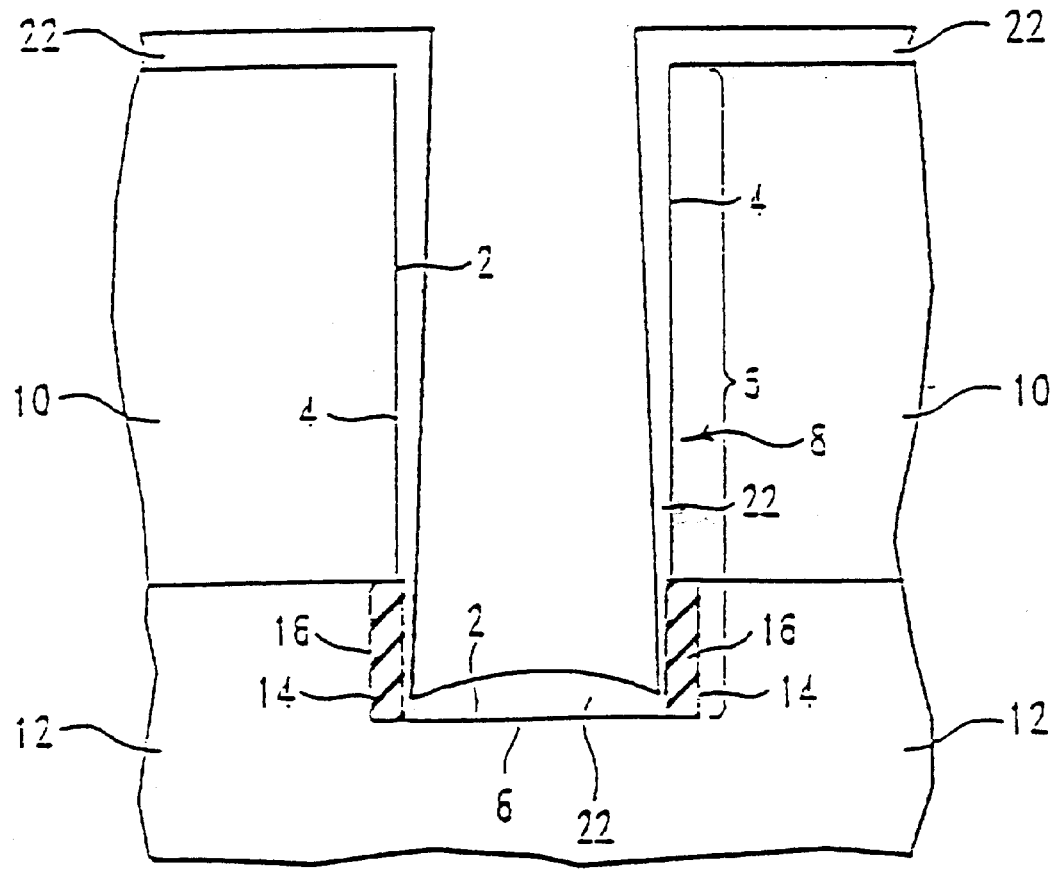
Figure 7:
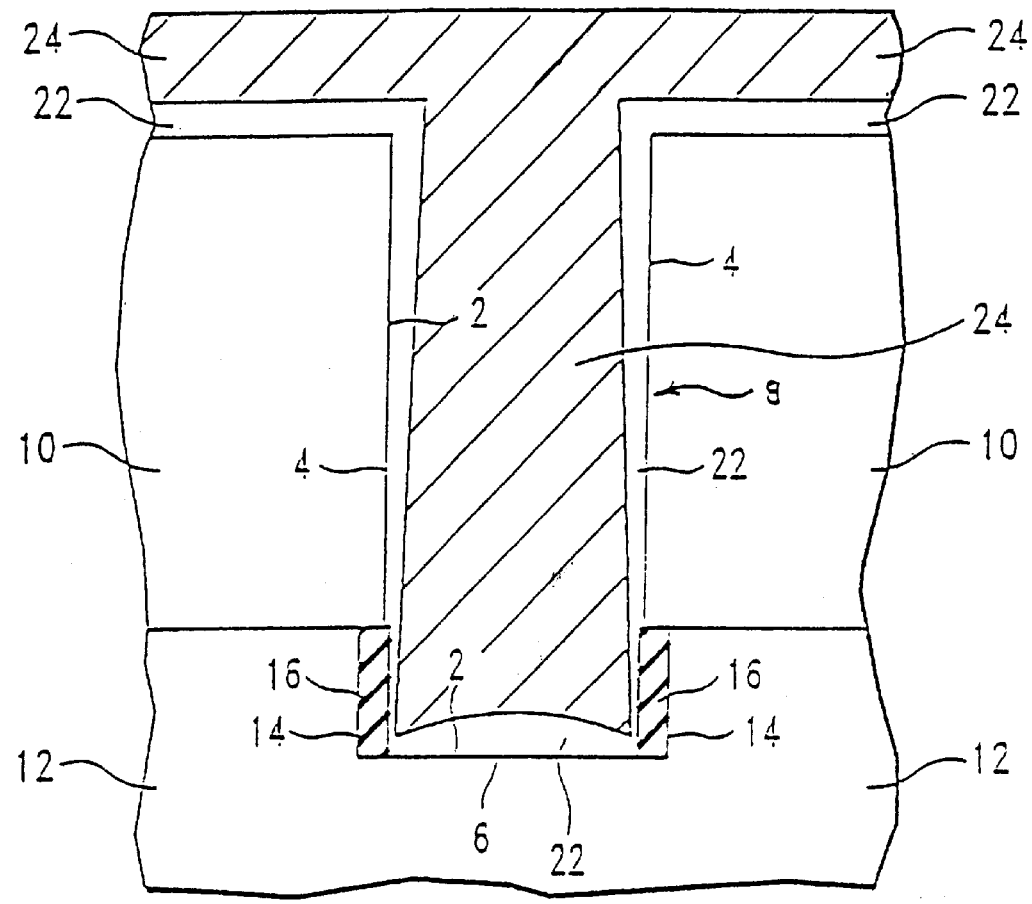

Referring to FIG. 7, the method of the present invention preferably further includes the step (e) of applying a metallic conductor 24 over the diffusion barrier layer 22. Aluminum and copper are the preferred metallic conductors for use in the method of the invention. Metallization of the contact with aluminum or copper is preferably performed using high density plasma sputter deposition, but may be applied by evaporation, electroplating, or chemical vapor deposition.

High density plasma sputter deposition of aluminum is described, for example, in U.S. application Ser. No. 08/511,825, of Xu et al., assigned to the assignee of the present invention, the disclosure of which is hereby incorporated by reference herein in its entirety and summarized below. Initially, a layer of cold-sputtered aluminum approximately 2,000 Å thick is applied over a barrier layer. This cold-sputtered aluminum layer, applied at a substrate temperature of about 150° C. or lower, provides a "seed" layer which adheres well to a titanium barrier layer. The bulk of the aluminum contact is then deposited by sputtering at a temperature within the range of about 350° C. to about 450° C. The DC power is adjusted depending upon the desired deposition rate. The sputtering is carried out in a process chamber over argon pressure ranging from about 0.5 mTorr to about 2 mTorr. This corresponds to an argon feed rate of about 35 sccm in an Applied Materials 5500 Integrated Process System chamber.

High density plasma sputter deposition of copper is described, for example, in U.S. application Ser. No. 08/855,059, of Ding et al., assigned to the assignee of the present invention, the disclosure of which is hereby incorporated by reference herein in its entirety and summarized below. In particular, the copper fill layer may be applied in a single-step process or in a two-step process. The selection of a single-step process or a two-step process depends on the composition and structure of the surface upon which the copper is being deposited and the feature size of the trench or via to be filled. In the single-step process, for feature sizes of about 0.75 μm or less, when the aspect ratio of the feature to be filled is less than approximately 3:1, the temperature of the substrate to which the copper fill layer is applied should range from about 200° C. to about 600° C. (preferably from about 200° C. to about 500° C.); when the aspect ratio is about 3:1 or greater, the copper fill layer should be applied over a temperature ranging from about 200° C. to about 600° C. (preferably from about 300° C. to about 500° C). The deposition can be initiated at the low end of the temperature range, with the temperature being increased during deposition.

In the two-step process, a thin, continuous wetting (bonding) layer of copper is applied at a substrate surface temperature of about 20° C. to about 250° C. The wetting layer thickness (on the wall of the trench or via) should be a minimum of about 50 Å, and typically may be about 100 Å to about 300 Å, depending on feature size and aspect ratio. Subsequently, the temperature of the substrate is increased, with the application of fill copper beginning at about 200° C. or higher and continuing as the temperature is increased to that appropriate for the feature size. When both the copper wetting layer and the copper fill layer are applied in a single process chamber, the deposition may be a continuous deposition. In such case, process conditions are varied during the deposition, with the copper fill layer being applied at a slower rate than the copper wetting layer, to provide better deposition control.

When the copper wetting layer is applied in one process chamber and the copper fill layer is applied in a second process chamber, typically the substrate with copper wetting layer already applied is placed on a heated support platen in the second process chamber. For a small feature size (0.5 $\mu$m or less) and an aspect ratio of 1:1 or greater, it is better to wait until the substrate is heated to a temperature of at least 200° C. prior to beginning application of the copper fill layer, or to begin the fill layer deposition at a slower rate while the substrate is heating.

High density plasma sputter deposition of copper is carried out using a copper target cathode having a 13.37 inch (33.96 cm) diameter, and DC power is applied to this cathode over a range from about 1 kW to about 5 kW. The substrate is placed a distance of about 5.5 inches (14 cm) from the copper target cathode. Typically, a substrate bias voltage ranging from 0 to about −100 V DC is applied to the substrate by application of power to the platen under the substrate. The RF bias power ranges from 0 W to about 500 W, and the frequency is typically from 350 kHz to 13.56 MHZ. In addition, a high density, inductively coupled RF plasma is generated in the region between the target cathode and the substrate by applying RF power to a coil (having from 1 to 3 turns) over a range from about 400 kHz to about 13.56 MHZ (preferably about 2 MHZ), at a wattage ranging from about 0.5 kW to about 5 kW (preferably about 1 kW to about 3 kW). The atmosphere in the process vessel is argon, the flow rate of the argon ranges from about 6 sccm to about 140 sccm, and the process vessel pressure ranges from about 5 mTorr to about 60 mTorr.

Referring again to FIG. 7, the method of the present invention greatly reduces or eliminates junction spiking at the bottom 6 of a contact via 8 when the via has been overetched, leaving exposed silicon sidewalls 14 adjacent the bottom 6 of the contact via 8. The presence of the dielectric layer 16 on the silicon sidewalls 14 of the contact via 8 is effective to protect this portion of the sidewall from silicon diffusion and subsequent current leakage.

The above described preferred embodiments are not intended to limit the scope of the present invention, as one skilled in the art can, in view of the present disclosure, expand such embodiments to correspond with the subject matter of the invention claimed below.

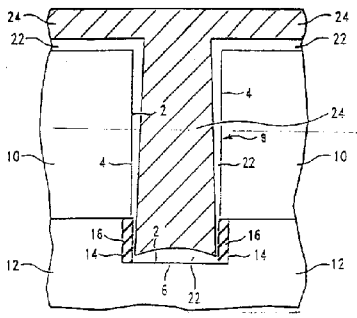

We claim:

1. A semiconductor contact microstructure which reduces junction spiking, said microstructure comprising a feature which includes a silicon base, at least one sidewall which includes a silicon portion in contact with and extending upward from said silicon base, and at least one dielectric portion comprising a first dielectric material which is in contact with and extending upward from said silicon portion of said sidewall to an opening at an upper edge of said sidewall, wherein, overlying at least said silicon portion of said sidewall is a layer of a second dielectric material comprising silicon oxide having a thickness ranging from about 50 A to about 100 A, and wherein a major portion of said silicon base remains exposed, whereby junction spiking is reduced.

2. The semiconductor contact microstructure of claim 1, further including a diffusion barrier layer overlying said silicon base, said second dielectric material, and at least a portion of said first dielectric material.

3. The semiconductor contact microstructure of claim 1 or claim 2, wherein the height of said silicon portion of said sidewall extending upward from said silicon base is less than about 0.5 $\mu$m.

4. The semiconductor contact microstructure of claim 1 or claim 2, wherein said second dielectric material is selected from the group consisting of silicon oxide, silicon nitride, PSG, and BPSG.

5. The semiconductor contact microstructure of claim 1, wherein said second dielectric material is thermally generated silicon oxide.

6. The semiconductor contact microstructure of claim 2, wherein said diffusion barrier layer comprises a material selected from the group consisting of titanium, titanium nitride, tantalum, tantalum nitride, and combinations thereof.

7. The semiconductor contact microstructure of claim 5, wherein said second dielectric material does not overlie a major portion of said first dielectric material.

8. The semiconductor contact microstructure of claim 1 or claim 2, wherein said second dielectric material protects subsequently deposited material from silicon diffusion from said silicon portion of said sidewall.

9. A semiconductor contact microstructure which reduces junction spiking, said microstructure comprising a feature which includes a silicon base, at least one sidewall which includes a silicon portion in contact with and extending upward from said silicon base, and at least one dielectric portion comprising a first dielectric material which is in contact with and extending upward from said silicon portion of said sidewall to an opening at an upper edge of said sidewall, wherein, overlying at least said silicon portion of said sidewall is a layer of a second dielectric material having a thickness ranging from about 50 Å to about 100 Å, wherein a major portion of said silicon base remains exposed, and wherein said second dielectric material is silicon oxide.

10. The semiconductor contact microstructure of claim 9, further including a diffusion barrier layer overlying said silicon base, said second dielectric material, and at least a portion of said first dielectric material.

11. The semiconductor contact microstructure of claim 9, wherein said second dielectric material is thermally generated silicon oxide.

12. The semiconductor contact microstructure of claim 10, wherein said second dielectric material is thermally generated silicon oxide.

* * * * *

UNITED STATES PATENT AND TRADEMARK OFFICE
CERTIFICATE OF CORRECTION

PATENT NO.    : 6,448,657 B1
DATED         : September 10, 2002
INVENTOR(S)   : Fernard Dorleans It is certified that error appears in the above-identified patent and that said Letters Patent is hereby corrected as shown below:

Title page should be deleted and substitute the attached title page.
Delete drawing sheets, 1-7, and substitute the attached drawing sheets.

<u>Column 2,</u>
Line 20, after "of" please delete "." and insert -- ; --.

<u>Column 3,</u>
Line 7, after "FIG." please delete "5." and insert -- 6. --.

<u>Column 7,</u>
Line 31, after "junction" please delete ",".
Line 40, after "sidewall" please delete "," and insert -- ; --

<u>Column 9,</u>
Line 1, after "thereof" please insert -- . --.
Line 31, please delete "ENDURAD®" and insert -- ENDURA® --.
Line 53, please delete "TaNs" and insert -- TaNx --.

<u>Column 12,</u>
Line 5, after "50" please delete "A" and insert -- Å --.
Line 5, after "100" please delete "A" and insert -- Å --.
Line 17, please delete "The semiconductor contact microstructure of claim 1 or".
Line 18, please delete "claim 2, wherein said second dielectric material is selected".
Line 19, please delete "from the group consisting of silicon oxide, silicon nitride,".
Line 20, please delete "PSG, and BPSG.".

Signed and Sealed this

Twenty-second Day of April, 2003

JAMES E. ROGAN
*Director of the United States Patent and Trademark Office*

(12) United States Patent
Dorleans

(10) Patent No.: US 6,448,657 B1
(45) Date of Patent: Sep. 10, 2002

(54) STRUCTURE FOR REDUCING JUNCTION SPIKING THROUGH A WALL SURFACE OF AN OVERETCHED CONTACT VIA

(75) Inventor: Fernand Dorleans, San Francisco, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/692,911

(22) Filed: Oct. 19, 2000

Related U.S. Application Data

(63) Continuation of application No. 09/296,144, filed on Apr. 21, 1999, now abandoned.
(51) Int. Cl.[7] ................................................ H01L 29/41
(52) U.S. Cl. ........................ 257/774; 257/330; 257/296; 257/306; 257/309
(58) Field of Search .......................... 438/589, 259, 438/270, 275, 789, 623, 637, 639, 675, 676; 257/330, 774, 306, 309, 296

(56) References Cited

U.S. PATENT DOCUMENTS

| | | | | |
|---|---|---|---|---|
| 4,641,420 A | * | 2/1987 | Lee | 29/511 |
| 4,897,703 A | * | 1/1990 | Spratt et al. | 357/34 |
| 4,916,083 A | * | 4/1990 | Monkowski et al. | 437/31 |
| 5,087,591 A | * | 2/1992 | Teng | 437/225 |
| 5,308,793 A | * | 5/1994 | Taguchi et al. | 437/194 |

(List continued on next page.)

OTHER PUBLICATIONS

U.S. Patent Application Serial No. 08/511,825, of Xu et al., filed Aug. 7, 1996.
U.S. Patent Application Serial No. 08/855,059, of Ding et al., filed May 13, 1997.
U.S. Patent Application Serial No. 08/995,108, of Ding et al., filed Dec. 19, 1997.

*Primary Examiner*—Richard Elms
*Assistant Examiner*—Douglas M Menz
(74) *Attorney, Agent, or Firm*—Shirley L. Church; Kathi Bean

(57) ABSTRACT

The present invention pertains to a semiconductor device microstructure, and to a method of forming that microstructure, which reduces or prevents junction spiking and to a method of forming that microstructure. In particular, a semiconductor contact microstructure comprises a feature which includes a silicon base and at least one sidewall extending upward from the silicon base. The sidewall includes a silicon portion in contact with the silicon base, where the height of the silicon portion of the sidewall above the silicon base is typically less than about 0.5 μm. The sidewall also includes at least one portion which comprises a first dielectric material which is in contact with (and typically extends upward from) the silicon portion of the sidewall. Overlying at least the silicon portion of the sidewall is a layer of a second dielectric material, preferably silicon oxide. Typically, a diffusion barrier layer overlies the silicon base, the layer of second dielectric material, and at least part of the sidewall portion which is comprised of the first dielectric material. The method comprises the steps of: a) providing a semiconductor device feature which includes a silicon base and at least one sidewall extending upward from the silicon base, where the sidewall includes at least one silicon portion in contact with the silicon base, and another portion comprising a first dielectric material which is in contact with the silicon portion of the sidewall; and b) creating a layer of a second dielectric material, preferably silicon oxide, over the at least one silicon sidewall portion. The method may include additional steps: c) sputter etching to remove dielectric material from the surface of the silicon base; and d) applying a diffusion barrier material over the silicon base, the layer of second dielectric material, and at least a portion of the sidewall comprising the first dielectric material. Typically, both the first and second dielectric materials are silicon oxide.

12 Claims, 7 Drawing Sheets